United States Patent
Yang

(10) Patent No.: US 11,309,293 B2
(45) Date of Patent: Apr. 19, 2022

(54) BACKLIGHT MODULE AND MANUFACTURING METHOD THEREOF, AND DISPLAY DEVICE

(71) Applicant: WUHAN CHINA STAR OPTOELECTRONICS TECHNOLOGY CO., LTD, Hubei (CN)

(72) Inventor: Yong Yang, Hubei (CN)

(73) Assignee: WUHAN CHINA STAR OPTOELECTRONICS TECHNOLOGY CO., LTD., Hubei (CN)

(*) Notice: Subject to any disclaimer, the term of this patent is extended or adjusted under 35 U.S.C. 154(b) by 114 days.

(21) Appl. No.: 16/638,760

(22) PCT Filed: Nov. 15, 2019

(86) PCT No.: PCT/CN2019/118942
§ 371 (c)(1),
(2) Date: Feb. 13, 2020

(87) PCT Pub. No.: WO2021/047030
PCT Pub. Date: Mar. 18, 2021

(65) Prior Publication Data
US 2021/0082883 A1    Mar. 18, 2021

(51) Int. Cl.
*H01L 25/075*  (2006.01)
*H01L 33/54*   (2010.01)
*H01L 33/56*   (2010.01)
*H01L 33/58*   (2010.01)

(52) U.S. Cl.
CPC .......... *H01L 25/0753* (2013.01); *H01L 33/54* (2013.01); *H01L 33/56* (2013.01); *H01L 33/58* (2013.01); *H01L 2933/005* (2013.01)

(58) Field of Classification Search
CPC ..... H01L 25/0753; H01L 33/54; H01L 33/56; H01L 33/58; H01L 2933/005
See application file for complete search history.

(56) References Cited

U.S. PATENT DOCUMENTS

| | | | |
|---|---|---|---|
| 9,634,203 B2 | 4/2017 | Ito et al. | |
| 2011/0085352 A1* | 4/2011 | Ito | H01L 33/54 362/617 |
| 2015/0287893 A1 | 10/2015 | Huang et al. | |

FOREIGN PATENT DOCUMENTS

| | | |
|---|---|---|
| CN | 201918420 U | 8/2011 |
| CN | 103199185 A | 7/2013 |
| CN | 104979457 A | 10/2015 |
| CN | 105449077 A | 3/2016 |
| JP | 2015018947 A | 1/2015 |

* cited by examiner

*Primary Examiner* — Jay C Chang
*Assistant Examiner* — Mikka Liu
(74) *Attorney, Agent, or Firm* — Mark M. Friedman

(57) ABSTRACT

The present disclosure provides a backlight module, a manufacturing method thereof, and a display device. The backlight module including a substrate, a plurality of LED chips disposed on the substrate, a plurality of encapsulation units encapsulating the LED chips in a one-to-one correspondence; each of the encapsulation units includes at least two encapsulation layers, an innermost one of the encapsulation layers completely covers the LED chip, and a refractive index of an encapsulation layer far from the LED chip is less than a refractive index of an encapsulation layer near the LED chip.

10 Claims, 2 Drawing Sheets

BACKLIGHT MODULE AND MANUFACTURING METHOD THEREOF, AND DISPLAY DEVICE

FIELD OF INVENTION

The present disclosure relates to the field of display technologies, and more particularly, to a display module and a manufacturing method thereof, and a display device.

BACKGROUND OF INVENTION

Mini-LEDs are currently hot spots on the market, and have a type of direct-type light-emitting backlight module. Compared with traditional direct-type backlight modules, the mini-LEDs have many advantages, such as being ultra-thin, flexible and bendable, and having an ability to achieve narrow bezels, local dimming (local backlight adjustment), etc. Local backlight adjustment uses a backlight consisting of hundreds of LEDs instead of cold cathode fluorescent lamp (CCFL), and can adjust the backlight LEDs according to a brightness of an image. Therefore, highlights in a display screen image can reach a maximum value, while brightness of dark portions can be maximumly decreased and even turned off to increase a contrast, which reduces backlight power consumption.

For direct-type backlight, shielding technology of light and shadow has become one of the hot spots of technological development. Because a distributed shape of LED light is similar to a Lambertian light distribution, which has higher central brightness and lower surrounding brightness, uneven brightness is easily produced during a direct light-emitting process. Currently, people use wide-angle light-emitting chips to achieve better light mixing effects. However, due to a lower light efficiency of the large-angle chips (usually 20% to 40% lower brightness than small-angle chips of a same size), it is difficult to achieve a balance between light mixing and light efficiency. Moreover, the wider the light-emitting angle of the chip, the lower the luminous efficiency. Therefore, how to achieve the balance between light mixing and light efficiency has become a difficulty in current technological development.

SUMMARY OF INVENTION

In order to solve the above technical problems, the present disclosure provides a backlight module, a manufacturing method thereof, and a display device, to solve the problem of uneven light caused by a small light-emitting angle of the backlight module of the prior art.

The technical solution to solve the above problems is that the present disclosure provides a backlight module including a substrate; a plurality of LED chips disposed on the substrate; a plurality of encapsulation units encapsulating the LED chips in a one-to-one correspondence, each of the encapsulation unit includes at least two encapsulation layers, wherein an innermost one of the encapsulation layers completely covers the LED chip, and a refractive index of the encapsulation layer far from the LED chip is less than a refractive index of the encapsulation layer near the LED chip.

Further, the encapsulation layer comprises a light-exiting surface, the light-exiting surface is a curved surface; and in two adjacent encapsulation layers, an outer one of the encapsulation layers covers the light-exiting surface of the inner one of the encapsulation layers, wherein a radius of curvature of the light-exiting surface of the inner one of the encapsulation layers is less than a radius of curvature of the light-exiting surface of the outer one of the encapsulation layers.

Further, adjacent encapsulation units are not in contact with each other.

Further, the material of the encapsulation layers includes a transparent silicone or an epoxy resin.

Further, a number of encapsulation layers of each of the encapsulation units is N, wherein N satisfies $2 \leq N \leq 5$.

Further, a diffusion layer disposed on a side of the encapsulation unit away from the substrate, a gap reserved between the diffusion layer and the encapsulation unit; and a light enhancement layer disposed on the diffusion layer.

The present disclosure further provides a method of manufacturing a backlight module, including providing a substrate; arranging a plurality of LED chips on the substrate; and forming a encapsulation unit on the LED chip by dispensing, spraying, or coating, each encapsulation unit individually encapsulates corresponding LED chip, and at least two encapsulation layers are sequentially formed on each LED chip from the inside to the outside, a refractive index of the encapsulation layer far from the LED chip is less than a refractive index of the encapsulation layer near the LED chip.

Further, in the process of forming the encapsulation unit, a material concentration of the encapsulation layer far from the LED chip is less than a material concentration of the encapsulation layer near the LED chip; and a viscosity of the material of the encapsulation layer far from the LED chip is less than a viscosity of the material of the encapsulation layer near the LED chip.

The present disclosure further provides a display device including the backlight module.

A backlight module, a manufacturing method thereof, and a display device of the present disclosure encapsulate the LED chip by a multilayer refractive index structure, significantly improving a luminous efficiency of the backlight module, increasing a light-emitting angle of the LED chip, and improving light mixing uniformity. By adopting a single-encapsulation LED chip to improve the luminous efficiency of the LED chip, less encapsulation unit materials are used and costs are reduced. The encapsulation unit adopts a multilayer encapsulation structure with a refractive index gradually decreasing outward from the LED chip and a curvature radius increasing from a side of the LED chip. Through a principle of geometrical light path, the light-emitting angle of the chip light in each dielectric film layer is gradually increased, finally achieving wide-angle light emission in an air layer, which greatly increases the light-emitting angle of the LED chip and improves the uniformity of light mixing. The manufacturing method of the present disclosure forms an encapsulation layer on the LED chip by dispensing, which is simple and conducive to mass production. At a same time, it can control refractive indexes of different encapsulation layers by changing a concentration and viscosity of an encapsulation layer material during dispensing.

DESCRIPTION OF FIGURES

In order to more clearly illustrate the technical solutions in the embodiments of the present disclosure, the figures used in the description of the embodiments will be briefly described below. It is obvious that the figures in the following description are only some embodiments of the present disclosure. Other figures can also be obtained from those skilled in the art based on these figures without paying any creative effort.

DETAILED DESCRIPTION OF PREFERRED EMBODIMENTS

The following embodiments of the present disclosure are described with reference to the accompanying figures to illustrate specific embodiments that can be implemented. The directional terms mentioned in the present disclosure, such as up, down, front, rear, left, right, top, bottom, etc., are only for reference to the direction of additional figures. Therefore, the directional terms used are for explaining and understanding, and not for limiting the present disclosure.

Embodiment 1

Figure 1:
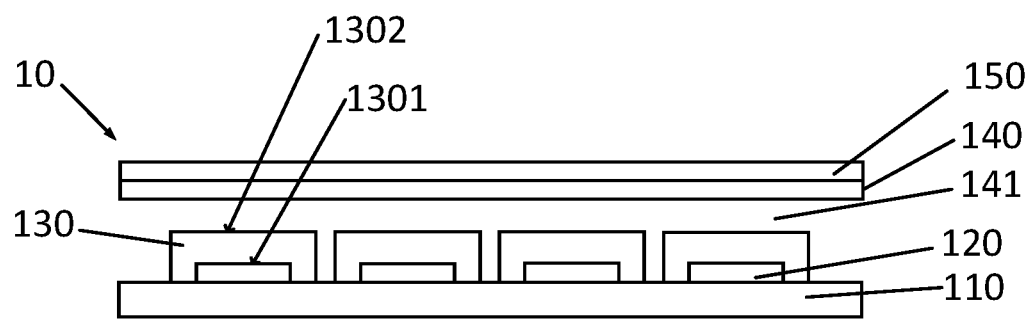
FIG. 1 shows a schematic diagram of a backlight module of an embodiment 1.

As shown in FIG. 1, in this embodiment, a backlight module 10 of the present disclosure includes a substrate 110, a plurality of LED chips 120, a plurality of first encapsulation units 130, a diffusion layer 140, and a light enhancement layer 150.

The substrate 110 is an FPC flexible board or a PCB/BT hardboard, and the plurality of the LED chips 120 are distributed on the substrate 110. The plurality of LED chips 120 are uniformly bonded to the substrate 110 by solder, and by replacing a backlight with separate light sources of the plurality of LED chips 120, local adjustment of an image can be achieved, thus increasing a contrast.

To increase a light-emitting angle and a light-emitting efficiency of the LED chips 120 of the backlight module 10 of the present disclosure, in this embodiment, one of the plurality of first encapsulation units 130 is used to encapsulate the LED chips 120 individually, and adjacent first encapsulation units 130 are not in contact with each other, wherein the plurality of first encapsulation units 130 are made of transparent silicone or epoxy materials having good ductility and high light transmittance.

Figure 2:
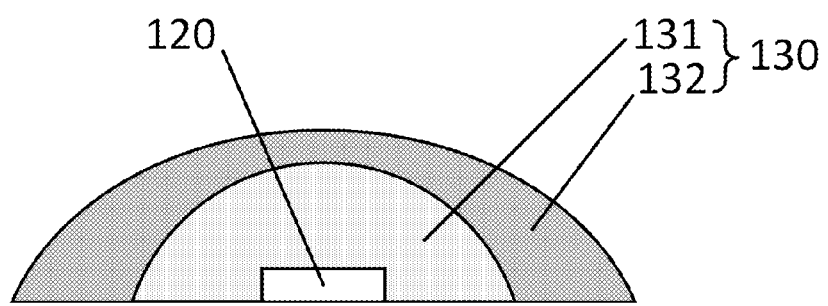
FIG. 2 shows a schematic structural diagram of an encapsulation unit of the embodiment 1.

As shown in FIG. 2, specifically, the plurality of first encapsulation units 130 encapsulate the LED chips 120 in one-to-one correspondence, and each of the first encapsulation units 130 includes a light entering side 1301 and a light exiting side 1302. Light emitted by the LED chips 120 passes through the light entering side 1301, enters the first encapsulation units 130, and enters the atmosphere through the light exiting side 1302 after being refracted.

Since a single-layer encapsulating layer cannot meet a requirement of a wide light-emitting angle, in this embodiment, any one of the first encapsulation units 130 of the present disclosure includes a first encapsulation layer 131 and a second encapsulation layer 132.

Figure 3:
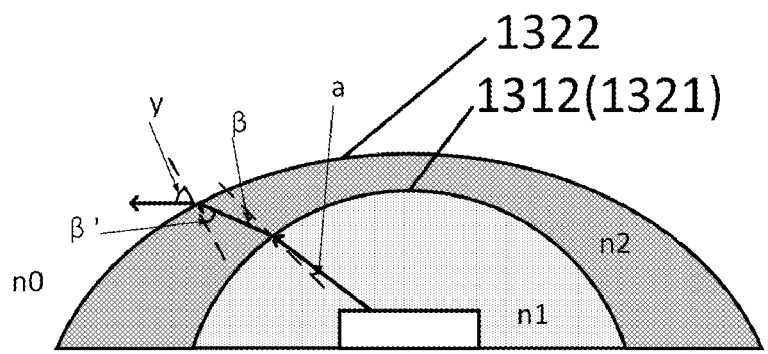
FIG. 3 shows a light refraction diagram of an LED chip of the embodiment 1.

As shown in FIG. 3, wherein the first encapsulation layer 131 is disposed on the LED chips 120 and completely surrounds the corresponding LED chips 120, a refractive index of the first encapsulation layer 131 is n1, and the first encapsulation layer 131 includes a first light-incident surface 1311 and a first light-exiting surface 1312, wherein the first light-incident surface 1311 is bonded to the LED chips 120, the first light-exiting surface 1312 is an arc-shaped convex surface, a refractive index of the atmosphere is n0, the second encapsulation layer 132 is disposed on the first encapsulation layer 131 and a refractive index of the second encapsulation layer 132 is n2. The second encapsulation layer 132 includes a second light-incident surface 1321 and a second light-exiting surface 1322. The second light-incident surface 1321 is bonded to the first light-exiting surface 1312 to ensure that light exits from the first light-exiting surface 1312 and directly enters the second light-incident surface 1321. The second light-incident surface 1321 is a curved concave surface, a shape of the curved concave surface is adapted to the first light-exiting surface 1312, the second light-exiting surface 1322 is a curved convex surface, and a radius of curvature of the second light-exiting surface 1322 is greater than a radius of curvature of the first light-exiting surface 1312, thereby achieving a purpose of gradually increasing the light-emitting angle of the LED chips 120.

In general, n0 is about 1.6. Assuming that a contact angle between the first encapsulation layer 131 and the second encapsulation layer 132, that is, an incident angle of the first light-exiting surface 1312 or the second light-incident surface 1321 is a and an exit angle is β, an incident angle of the second light-exiting surface 1322 in contact with the atmosphere is β', and an exit angle is y, then $n1*\sin(a)=n2*\sin(β)$, $n2*\sin(β')=n0*\sin(y)$. Since the radius of curvature of the second light-exiting surface 1322 is greater than the radius of curvature of the first light-exiting surface 1312, so β'>β, the exit angle y is greater than an exit angle of only one encapsulation layer, thereby achieving a purpose of emitting light at a wider angle and improving the uniformity of light mixing.

The diffusion layer 140 is disposed on a side of the encapsulation layer 130 away from the substrate 110. In order to ensure that a light-emitting angle of the LED chips 120 reaches a maximum value, a gap 141 is reserved between the diffusion layer 140 and the encapsulation layer 130.

The light enhancement layer 150 is disposed on the diffusion layer 140, that is, a side of the diffusion layer 140 away from the encapsulation layer 130. The light enhancement layer 150 is used to increase the brightness of the backlight module 10 and achieve the effect of increasing light.

In order to explain the present disclosure better, this embodiment provides a method of manufacturing a backlight module, the specific steps are as follows: providing a substrate; arranging a plurality of LED chips on the substrate; and forming encapsulation units on the LED chips, wherein each of the encapsulation units individually encapsulates a corresponding LED chip, two encapsulation layers are formed on each of the LED chips, including a first encapsulation layer and a second encapsulation layer, and a refractive index of an encapsulation layer far from the LED chip is less than a refractive index of an encapsulation layer near the LED chip. Specifically, the encapsulation units are formed by dispensing, spraying, or coating. A difference of the refractive index of the encapsulation layer and an appearance are achieved by changing a concentration and a viscosity of the material of the encapsulation layer. In this embodiment, a material concentration of the encapsulation layer far from the LED chip is less than a material concentration of the encapsulation layer near the LED chip, so that a refractive index of the encapsulation layer far from the LED chip is less than a refractive index of the encapsulation layer near the LED chip. A material viscosity of the encapsulation layer far from the LED chip is less than a material viscosity of the encapsulation layer near the LED chip, so that a radius of curvature of the light-exiting surface of the encapsulation layer far from the LED chip is greater than a radius of curvature of the light-exiting surface of the encapsulation layer near the LED chip.

Embodiment 2

Figure 4:
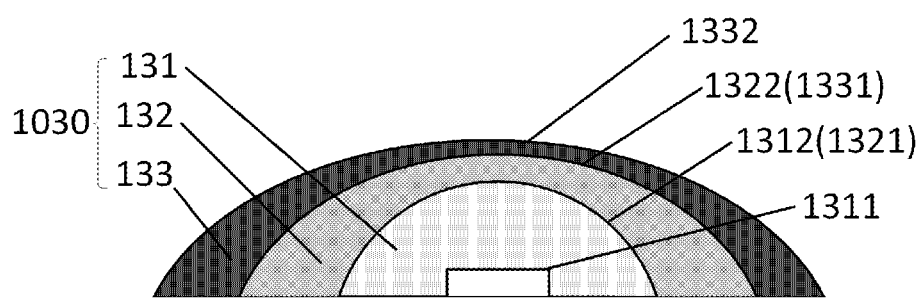
FIG. 4 shows a schematic structural diagram of an encapsulation unit of an embodiment 2.

As shown in FIG. 4, a structure of a backlight module 11 in this embodiment is similar to the backlight module 10 of embodiment 1. The difference is that a second encapsulation unit 1030 in this embodiment further includes a third encapsulation layer 133. The third encapsulation layer 133 includes a third light-incident surface 1331 and a third light-exiting surface 1332. The third light-incident surface 1331 and the second light-exiting surface 1322 of the second encapsulation layer 132 are bonded together. A shape of the third light-incident surface 1331 is a curved inner concave surface, and is adapted to the second light-exiting surface 1322 to ensure that light enters the third light-incident surface 1331 directly after exiting from the second light-exiting surface 1322. The third light-exiting surface 1332 is an arc-shaped convex surface, and a radius of curvature thereof is greater than a radius of curvature of the second light-exiting surface 1322, thereby achieving the purpose of gradually increasing the light-emitting angle of the LED chip 120.

In other preferred embodiments of the present disclosure, the second encapsulation unit 1030 may further include a fourth encapsulation layer and a fifth encapsulation layer, shapes of which are similar to the third encapsulation layer 133, and a radius of curvature gradually decreases from a side away from the LED chip 120 toward the LED chip 120.

Figure 5:
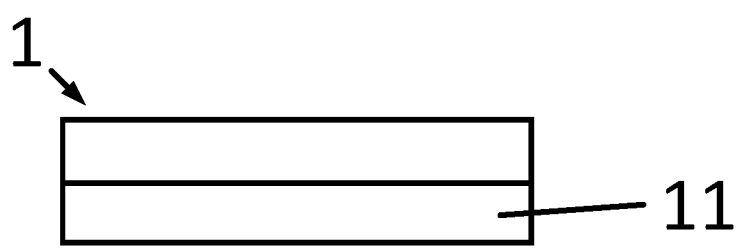
FIG. 5 shows a schematic diagram of a display device of the embodiment 2.

As shown in FIG. 5, in this embodiment, a display device 1 of the present disclosure includes the backlight module 11, and its technical features and effects are fully reflected on the backlight module 11, the other parts of the display device 1 are not described in detail.

The above are only preferred embodiments of the present disclosure, and are not intended to limit the present disclosure. Any modification, equivalent replacement, and improvement made within the spirit and principle of the present disclosure shall be included in the protection scope of the present disclosure.

What is claimed is:

1. A backlight module, comprising:
a substrate;
a plurality of LED chips disposed on the substrate; and
a plurality of encapsulation units encapsulating the LED chips in a one-to-one correspondence, each of the encapsulation units comprises at least two encapsulation layers, wherein an innermost one of the encapsulation layers completely covers the LED chip, and a refractive index of the encapsulation layer far from the LED chip is less than a refractive index of the encapsulation layer near the LED chip;
wherein the encapsulation layer comprises a light-exiting surface, the light-exiting surface is a curved surface; and
in two adjacent encapsulation layers, an outer one of the two adjacent encapsulation layers covers the light-exiting surface of an inner one of the two adjacent encapsulation layers, wherein a radian of the light-exiting surface of the inner one of the encapsulation layers is greater than a radian of curvature of the light-exiting surface of the outer one of the encapsulation layers.

2. The backlight module as claimed in claim 1, wherein a radius of curvature of the light-exiting surface of the inner one of the encapsulation layers is less than a radius of curvature of the light-exiting surface of the outer one of the encapsulation layers.

3. The backlight module as claimed in claim 1, wherein adjacent encapsulation units are not in contact with each other.

4. The backlight module as claimed in claim 1, wherein a refractive index of the innermost one of the encapsulation layers is less than or equal to 1.6.

5. The backlight module as claimed in claim 1, wherein a material of the encapsulation layers includes transparent silicone or epoxy resin.

6. The backlight module as claimed in claim 1, wherein a number of encapsulation layers of each of the encapsulation units is N, wherein N satisfies 2≤N≤5.

7. The backlight module as claimed in claim 1, further comprising:
a diffusion layer disposed on a side of the encapsulation units away from the substrate;
a gap reserved between the diffusion layer and the encapsulation units; and
a light enhancement layer disposed on the diffusion layer.

8. A display device, comprising the backlight module as claimed in claim 1.

9. A method of manufacturing a backlight module, comprising:
providing a substrate;
arranging a plurality of LED chips on the substrate; and
forming encapsulation units on the LED chips by dispensing, spraying, or coating; wherein each of the encapsulation units individually encapsulates a corresponding LED chip, at least two encapsulation layers are sequentially formed on each of the LED chips from an inside to an outside, and a refractive index of the encapsulation layer far from the LED chip is less than a refractive index of the encapsulation layer near the LED chip;
wherein the encapsulation layer comprises a light-exiting surface, the light-exiting surface is a curved surface; and
in two adjacent encapsulation layers, an outer one of the two adjacent encapsulation layers covers the light-exiting surface of an inner one of the two adjacent encapsulation layers, wherein a radian of the light-exiting surface of the inner one of the encapsulation layers is greater than a radian of curvature of the light-exiting surface of the outer one of the encapsulation layers.

10. The method of manufacturing the backlight module as claimed in claim 9, wherein
in the step of forming the encapsulation units, a material concentration of the encapsulation layer far from the LED chip is less than a material concentration of the encapsulation layer near the LED chip; and
a material viscosity of the encapsulation layer far from the LED chip is less than a material viscosity of the encapsulation layer near the LED chip.

* * * * *